US011217359B2

(12) United States Patent
Jiu et al.

(10) Patent No.: US 11,217,359 B2
(45) Date of Patent: Jan. 4, 2022

(54) METHOD FOR SYNTHESIZING COPPER-SILVER ALLOY, METHOD FOR FORMING CONDUCTION PART, COPPER-SILVER ALLOY, AND CONDUCTION PART

(71) Applicants: SENJU METAL INDUSTRY CO., LTD., Tokyo (JP); OSAKA UNIVERSITY, Osaka (JP)

(72) Inventors: Jinting Jiu, Tokyo (JP); Minoru Ueshima, Tokyo (JP); Katsuaki Suganuma, Osaka (JP); Wanli Li, Osaka (JP)

(73) Assignees: SENJU METAL INDUSTRY CO., LTD., Tokyo (JP); OSAKA UNIVERSITY, Osaka (JP)

( * ) Notice: Subject to any disclaimer, the term of this patent is extended or adjusted under 35 U.S.C. 154(b) by 0 days.

(21) Appl. No.: 16/634,002

(22) PCT Filed: Jul. 24, 2018

(86) PCT No.: PCT/JP2018/027602
§ 371 (c)(1),
(2) Date: Jan. 24, 2020

(87) PCT Pub. No.: WO2019/022039
PCT Pub. Date: Jan. 31, 2019

(65) Prior Publication Data
US 2020/0381136 A1  Dec. 3, 2020

(30) Foreign Application Priority Data
Jul. 25, 2017  (JP) .............................. JP2017-144038

(51) Int. Cl.
*C22C 5/08*  (2006.01)
*H01B 1/02*  (2006.01)
(Continued)

(52) U.S. Cl.
CPC ........... *H01B 1/026* (2013.01); *C09D 11/037* (2013.01); *C09D 11/52* (2013.01); *C22C 1/00* (2013.01);
(Continued)

(58) Field of Classification Search
CPC ........... C22C 5/06; C22C 1/0466; C22C 5/08; C22C 1/0425
See application file for complete search history.

(56) References Cited

U.S. PATENT DOCUMENTS

2003/0148024 A1   8/2003  Kodas et al.
2012/0329209 A1*  12/2012  Song ................. H01L 21/02521
                                                                      438/104
(Continued)

FOREIGN PATENT DOCUMENTS

CN   102270514 A   12/2011
CN   102675960 A    9/2012
(Continued)

OTHER PUBLICATIONS

Strehle, S. et al. "Microstructure of electroplated Cu(Ag) alloy thin films." 2011. Thin Solid Films. 519. p. 3522-3529. (Year: 2011).*
(Continued)

*Primary Examiner* — Nicholas A Wang
(74) *Attorney, Agent, or Firm* — Leason Ellis LLP

(57) ABSTRACT

A method for synthesizing a copper-silver alloy includes an ink preparation step, a coating step, a crystal nucleus formation step and a crystal nucleus synthesis step. In the ink preparation step, a copper salt particle, an amine-based solvent, and a silver salt particle are mixed, thereby preparing a copper-silver ink. In the coating step, a member to be coated is coated with the copper-silver ink. In the crystal nucleus formation step, at least one of a crystal nucleus of copper having a crystal grain diameter of 0.2 μm or less and
(Continued)

a crystal nucleus of silver having a crystal grain diameter of 0.2 μm or less is formed from the copper-silver ink. In the crystal nucleus synthesis step, the crystal nucleus of copper and the crystal nucleus of silver are synthesized.

2 Claims, 4 Drawing Sheets

(51) Int. Cl.

| | | |
|---|---|---|
| *C23C 18/14* | (2006.01) | |
| *C09D 11/037* | (2014.01) | |
| *C09D 11/52* | (2014.01) | |
| *C22C 1/00* | (2006.01) | |
| *C22C 9/00* | (2006.01) | |
| *C23C 18/08* | (2006.01) | |

(52) U.S. Cl.
CPC .................. *C22C 5/08* (2013.01); *C22C 9/00* (2013.01); *C23C 18/08* (2013.01); *C23C 18/143* (2019.05)

(56) References Cited

U.S. PATENT DOCUMENTS

| | | |
|---|---|---|
| 2014/0301892 A1 | 10/2014 | Maekawa et al. |
| 2014/0308158 A1 | 10/2014 | Maekawa et al. |
| 2015/0098858 A1 | 4/2015 | Maekawa et al. |
| 2016/0044778 A1 | 2/2016 | Irie et al. |
| 2017/0369969 A1 | 12/2017 | Maekawa et al. |
| 2018/0304356 A1 | 10/2018 | Maekawa et al. |

FOREIGN PATENT DOCUMENTS

| | | |
|---|---|---|
| CN | 104407735 A | 3/2015 |
| CN | 105921737 A | 9/2016 |
| JP | 2006-183110 A | 7/2006 |
| JP | 2013-196881 A | 9/2013 |
| JP | 2015-147929 A | 8/2015 |
| JP | 5983805 B2 | 9/2016 |
| JP | 2017-041504 A | 2/2017 |
| JP | 2017-074702 A | 4/2017 |
| WO | WO-2013/073241 A1 | 5/2013 |
| WO | WO-2014/156489 A1 | 10/2014 |

OTHER PUBLICATIONS

Li, W. et al. "Supporting information. Printable and flexible copper-silver alloy electrodes with high conductivity and ultrahigh oxidation resistance." 2017. Applied materials and interfaces. 9. p. 24711-24721. (Year: 2017).*

Shafiei, S. et al. "Effect of combination on properties of Cu-Ag nanocomposites synthesized by heat treatment." IJE transaction B: applications. 23. 2010. p. 209-214 (Year: 2010).*

Extended European search Report dated Jul. 2, 2020 for the corresponding European Patent Application No. 18838388.9.

Chinese Office Action dated Jul. 2, 2020 for the corresponding Chinese Patent Application No. 201880049672.8.

Wanli Li et al., "Printable and Flexible Copper-Silver Alloy Electrodes with High Conductivity and Ultrahigh Oxidation Resistance", ACS Applied Materials & Interfaces, Jul. 17, 2017, pp. 24711-24721, vol. 9, No. 29.

International Search Report dated Oct. 30, 2018 for the corresponding PCT International Patent Application No. PCT/JP2018/027602.

Written Opinion of the International Searching Authority dated Mar. 5, 2019 for the corresponding PCT International Patent Application No. PCT/JP2018/027602.

Seizo Nagasaki and Makoto Hirabayashi, "Binary Alloy Phase Diagrams", AGNE Gijutsu Center Inc., May 30, 2013, pp. 4 (See paragraph [0012] of the Specification as initially filed for relevancy).

* cited by examiner

— Crystal nucleus of silver

— Crystal nucleus of copper

— Copper-silver alloy

— Copper-silver alloy

METHOD FOR SYNTHESIZING COPPER-SILVER ALLOY, METHOD FOR FORMING CONDUCTION PART, COPPER-SILVER ALLOY, AND CONDUCTION PART

CROSS-REFERENCE TO RELATED PATENT APPLICATIONS

This application is a U.S. National Phase Application under 35 U.S.C. § 371 of International Patent Application No. PCT/JP2018/027602, filed Jul. 24, 2018, and claims the benefit of priority to Japanese Patent Application No. 2017-144038, filed on Jul. 25, 2017, all of which are incorporated herein by reference in their entirety. The International Application was published in Japanese on Jan. 31, 2019 as International Publication No. WO/2019/022039 under PCT Article 21(2).

FIELD OF THE INVENTION

The present invention relates to a method for synthesizing a copper-silver alloy by which a copper-silver alloy can be easily synthesized at a low temperature in a short time period, and to a method for forming a conduction part, a copper-silver alloy, and a conduction part.

BACKGROUND OF THE INVENTION

Nowadays, wearable devices are rapidly developed. Wearable devices are supposed to be utilized in the state of being worn on a body, and are required to be reduced in size or thickness. Electronic components for use in these devices are also required to satisfy similar requirements so as to meet that requirement. Since size and thickness reductions in the electronic components are accompanied with a decrease in heat resistance, wiring materials which can be formed by a simple process, such as short-time heating or low-temperature bonding, have been proposed. Electroconductive inks such as copper inks, silver inks, and copper-silver inks are used for these wiring materials, and investigations are being made on electroconductive inks and techniques for forming wiring using the electroconductive ink.

JP2015-147929 A proposes a method for producing an electroconductive portion including copper as a main component, the method being capable of forming the electroconductive portion at a low temperature region such that resins can be utilized as base materials. JP2015-147929 A discloses that, in the production method described therein, a copper ink is printed on a substrate and then heat-treated for 10 minutes to 60 minutes at a temperature range of 60° C. to 300° C. JP2015-147929 A further discloses an ink composition including: a copper salt composed of carboxylic acids having a reducing function and copper ions; a coordinating compound for stabilizing the reducing function; and metallic silver or a silver metalcarboxylate for enhancing the reducing function. Specifically, JP 2015-147929 A describes in Example 7 that an ink composition including fine particles of copper salts, hexamethylimine, and fine particles of silver is prepared and applied to a base material and thereafter the base material is heat-treated at 140° C. for 30 minutes in an atmosphere through which nitrogen gas is passing, thereby forming a conduction part.

JP2013-196881 A discloses a method for electroconductive-pattern formation for efficiently making a pattern of a composition printed on a substrate electroconductive. In this method, a composition including metal oxide particles having a flat shape, a reducing agent, and a binder resin is used and the composition is irradiated with pulsed light or microwaves. JP2013-196881 A discloses, as the method for electroconductive-pattern formation described therein, a method in which a paste obtained by mixing flat copper oxide particles, a reducing agent, and a resin is printed on a substrate and the printed paste is irradiated with a single-shot pulse wave under the conditions of a voltage of 250 V, a pulse width of 1,600 μs, and a pulse energy of 3.47 J/cm².

WO 2013/073241 A1 discloses a method for producing a copper-silver alloy containing no copper-silver eutectoid. Specifically, WO 2013/073241 A1 discloses a production method in which a fluid containing copper ions and silver ions is mixed with a fluid containing a reducing agent to thereby precipitate copper-silver alloy particles having a particle diameter of 50 nm or less and containing no eutectoid. Although WO 2013/073241 A1 does not clearly describe any means for forming a conduction part on a substrate, WO 2013/073241 A1 describes that since the copper-silver alloy powder having a particle diameter of 50 nm or less is used, circuits can be formed on plastic substrates by a low-temperature coating and sintering process.

Technical Problems

In the invention described in JP2015-147929 A, the heat treatment time and the heat treatment temperature are specified for the purposes of volatilizing off the coordinating compound and reducing the copper ions. JP2015-147929 A describes that, in order to achieve the purposes, fine particles of a composite of the metal particles or metal salt, which is for accelerating the reduction of copper ions, with fine particles of copper salt are not formed. Consequently, the invention described in JP2015-147929 A does not employ any compositing method such as a method for alloying the two kinds of particles.

JP2015-147929 A describes that an electroconductive member made of copper can be formed by merely performing a heat treatment for 10 minutes to 60 minutes at a temperature range of 60° C. to 300° C. These heating conditions can hence be regarded as conditions under which the fine copper particles are not alloyed with the fine silver particles. Consequently, the conduction member obtained by the production method described in JP 2015-147929 A, which is made of copper, has a problem that increase in resistivity of this conductive member is caused by oxidation.

The invention described in JP2013-196881 A may be efficient only with respect to the step of making the composition for conductive-patter formation electroconductive, but flat oxide particles, a reducing agent, and a resin must be prepared. JP2013-196881 A describes only a method for producing flat oxide particles, and it is unclear whether flat particles of other metal oxides are obtained by the same method. In a case where particles of a metal oxide are obtained only as spherical particles, these particles must be made flat with a ball mill or the like, resulting in complicated production process. Meanwhile, the irradiation with pulsed light in JP2013-196881 A is intended to remove oxides present on the surface of the particles, together with the reducing agent. Although JP2013-196881 A hence describes that metallic particles of an alloy may also be used, copper alloy formation with pulsed light is not supposed therein at all. Consequently, the conduction member obtained by the production method described in JP2013-196881 A includes copper as a main component and hence has a problem that increase in resistivity of this conduction member is caused by oxidation, as in JP2015-147929 A.

As described above, copper is susceptible to oxidation and it is necessary, for sintering copper, to conduct irradiation with pulsed light or to use a reducing vacuum or a reducing atmosphere such as hydrogen atmosphere. In addition, the produced copper wiring has a fine line width and is hence more prone to oxidize in the air. Meanwhile, silver inks are expensive and there are cases where the wiring formed therefrom short-circuits due to migration, as described in JP2015-147929 A.

It seems effective to alloy the fine copper particles with the fine silver particles in the ink described in JP2015-147929 A, for overcoming those problems of silver and copper. However, for forming an evenly dispersed copper-silver alloy, it is necessary to conduct long-term heating at a high temperature of about 1,200° C., as apparent from the Ag-Cu binary phase diagram shown in Seizo NAGASAKI and Makoto HIRABAYASHI, "Binary Alloy Phase Diagrams", AGNE Gijutsu Center Inc., May 30, 2013, p.4, although it depends on the particle diameters of the two kinds of particles. In addition, since a crystal grain diameter is too large, it is impossible to obtain an even structure. It is hence difficult to apply it to wearable devices from the standpoints of alloy formation temperature and structure. Furthermore, the invention described in JP2015-147929 A and the invention described in JP 2013-196881 A share the object of forming copper wiring, and alloying is hence not supposed therein. Because of this, formation of a copper-silver alloy is not achieved on the basis of the two inventions.

In a case where copper-silver particles are formed by a reduction method as in WO 2013/073241 A1, it is difficult to cause copper and silver to simultaneously undergo a reduction reaction because of a difference in oxidation-reduction potential. It is hence difficult to imagine that merely mixing a fluid containing copper ions and silver ions with a fluid containing a reducing agent yields a copper-silver alloy as disclosed in WO 2013/073241 A1. Various contrivances for reducing the difference in oxidation-reduction potential are necessary, and this may result in complicated processes.

Moreover, the inventions described in JP2013-196881 A and WO 2013/073241 A1 necessitate use of a special reducing agent, making it difficult to reduce the production cost.

As described above, it is difficult to easily synthesize a copper-silver alloy at a low-temperature in a short time period or to form a conduction part using it by any of those conventional methods, the alloy synthesis and the conduction part formation being desired because of the rapid development of wearable devices.

Accordingly, an object of the present invention is to provide a method for synthesizing a copper-silver alloy by which a copper-silver alloy can be easily synthesized at a low temperature in a short time period, a method for forming a conduction part, a copper-silver alloy, and a conduction part.

SUMMARY OF THE INVENTION

Solution to Problems

The present inventors conducted investigation on the premise that a copper-silver alloy is used in order to avoid the problem of oxidation associated with copper and the problem of migration associated with silver. The present inventors directed attention to the behavior of copper-silver alloys during sintering in order to form a copper-silver alloy without using a reducing agent as in WO 2013/073241 A1. The present inventors found that, after fine crystal nuclei of silver and copper were formed, the diffusion and growth of copper and silver occurred from the crystal nuclei as starting points, thereby forming a copper-silver alloy.

Examples of common methods for producing a copper-silver alloy include an atomization method and the like besides the high-temperature melting method and liquid-phase reduction method described above. However, these methods each employ a high-temperature treatment and necessitate a complicated process. The method in which a reducing agent is used has problems of increase in cost and the like. It is hence difficult to apply any of these common methods to flexible substrates or components which have low heat resistance.

The present inventors, directing attention to formation of fine crystal nuclei of silver and copper and synthesis of a copper-silver alloy therefrom, dared to make investigations on a synthesis method based on heating performed at a low temperature for a short time period.

First, the present inventors added a silver salt as fine silver particles to thereby evenly disperse the particles in an ink and yielded fine crystal nuclei of metallic copper and metallic silver by conducting heating at a given temperature for a given time period. This method, however, is unable to alloy copper with silver under the conditions applicable to wearable devices, like the method described in JP2015-147929 A. Although it may be thought that to conduct heating at a low temperature for a long period of time is effective in alloying, such long-period heating is undesirable from the standpoint of production process simplification. Even when a reduction method is used, complicated processes are necessary for reducing the difference in oxidation-reduction potential between copper and silver. The present inventors yielded crystal nuclei of copper and silver at a low temperature and thereafter irradiated these crystal nuclei with pulsed light having a given energy density, which had been commonly used for removing oxide films, purposely for a short time period. As a result, it was unexpectedly found that these crystal nuclei were synthesized by the irradiation and a copper-silver alloy was formed. In a case where the crystal nuclei have a small grain diameter, the resultant copper-silver alloy has a homogeneous structure, making it possible to reduce the resistance of conduction parts.

It has also been found that the copper-silver alloy obtained by such a synthesis method has a crystal grain diameter of 0.1 μm or less and satisfies at least one of a requirement that a difference between a peak of (111) plane angle of the Cu and a peak of (111) plane angle of pure Cu is at least 0.3% of the peak of (111) plane angle of the pure Cu and a requirement that a difference between a peak of (111) plane angle of the Ag and a peak of (111) plane angle of pure Ag is at least 0.1% of the peak of (111) plane angle of the pure Ag.

The present inventors have further found that the crystal nuclei of copper can be inhibited from oxidizing by optimizing the conditions for forming the crystal nuclei. Furthermore, the present inventors have found that, by optimizing the conditions for forming the crystal nuclei, a copper-silver alloy can be synthesized in a short time period and the crystal nuclei can be inhibited from flying off.

The present invention achieved based on these findings is as follows.

(1) A method for synthesizing a copper-silver alloy, comprising:
an ink preparation step of mixing a copper salt particle, an amine-based solvent, and a silver salt particle, thereby preparing a copper-silver ink;
a coating step of coating a member to be coated with the copper-silver ink;
a crystal nucleus formation step of forming at least one of a crystal nucleus of copper having a crystal grain diameter of 0.2 µm or less and a crystal nucleus of silver having a crystal grain diameter of 0.2 µm or less from the copper-silver ink; and
a crystal nucleus synthesis step of synthesizing the crystal nucleus of copper and the crystal nucleus of silver.
(2) The method for synthesizing a copper-silver alloy according to the above (1), wherein in the crystal nucleus formation step, a first-heating of heating the member that has been coated with the copper-silver ink at 70° C. to 300° C. for 1 minute to 300 minutes is performed.
(3) The method for synthesizing a copper-silver alloy according to the above (1) or (2), wherein in the crystal nucleus synthesis step, a second-heating of irradiating the crystal nucleus of copper and the crystal nucleus of silver with pulsed light having an energy density of 0.5 J/cm² to 5.0 J/cm² for an irradiation time of 1 s or less is performed.
(4) The method for synthesizing a copper-silver alloy according to any one of the above (1) to (3), wherein after the crystal nucleus formation step and before the crystal nucleus synthesis step, the member coated is cooled to a temperature region of lower than 60° C.
(5) The method for synthesizing a copper-silver alloy according to any one of the above (1) to (4), wherein the copper-silver ink further contains a dispersion medium.
(6) The method for synthesizing a copper-silver alloy according to any one of the above (1) to (5), comprising a preheating step of performing preheating at 25° C. or higher and lower than 70° C. for 0 minute to 10 minutes, after the coating step and before the crystal nucleus formation step.
(7) A method for forming a conduction part, comprising the method for synthesizing a copper-silver alloy according to any one of the above (1) to (6).
(8) A copper-silver alloy consisting of Cu and Ag, having a crystal grain diameter of 0.1 µm or less, and satisfying at least one of a requirement that a difference between a peak of (111) plane angle of the Cu and a peak of (111) plane angle of pure Cu is at least 0.3% of the peak of (111) plane angle of the pure Cu and a requirement that a difference between a peak of (111) plane angle of the Ag and a peak of (111) plane angle of pure Ag is at least 0.1% of the peak of (111) plane angle of the pure Ag.
(9) The copper-silver alloy according to the above (8), satisfying the requirement that the difference between the peak of (111) plane angle of the Cu and the peak of (111) plane angle of pure Cu is at least 0.3% of the peak of (111) plane angle of the pure Cu and the requirement that the difference between the peak of (111) plane angle of the Ag and the peak of (111) plane angle of pure Ag is at least 0.1% of the peak of (111) plane angle of the pure Ag.
(10) A conduction part comprising the copper-silver alloy according to the above (8) or (9).

BRIEF DESCRIPTION OF THE DRAWINGS

FIG. 2A is a surface SEM photograph in the case of Comparative Example 6; FIG. 2B is a surface SEM photograph in the case of Invention Example 13; and FIG. 2C is a surface SEM photograph in the case of Invention Example 9.

FIG. 5A is a surface SEM photograph in the case of Invention Example 9; FIG. 5B is a rupture-surface SEM photograph in the case of Invention Example 9; FIG. 5C is a surface SEM photograph in the case of Comparative Reference Example; and FIG. 5D is a rupture-surface SEM photograph in the case of Comparative Reference Example.

DETAILED DESCRIPTION OF THE INVENTION

1. Method for Synthesizing Copper-Silver Alloy

Figure 1:
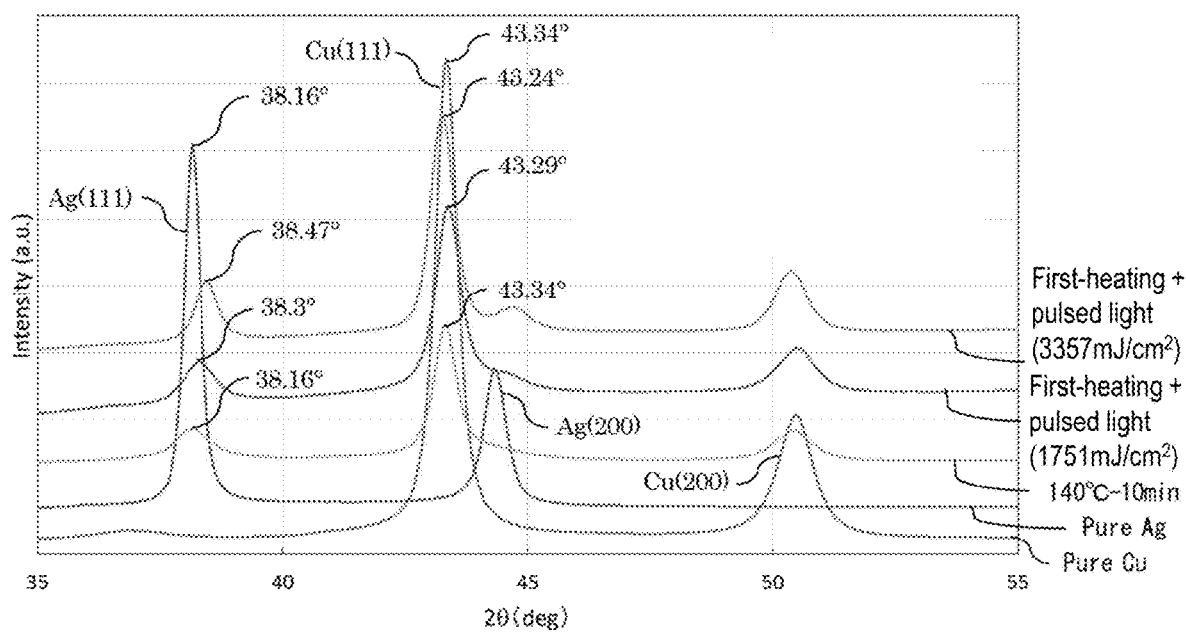
FIG. 1 is a chart showing the results of an X-ray diffractometry (XRD) experiment obtained in Comparative Example 1, Comparative Example 2, Comparative Example 6, Invention Example 13, and Invention Example 9.

The method for synthesizing a copper-silver alloy in the present invention includes (1) an ink preparation step of mixing a copper salt particle, an amine-based solvent, and a silver salt particle, thereby preparing a copper-silver ink, (2) a coating step of coating a member to be coated with the copper-silver ink, (3) a crystal nucleus formation step of forming at least one of a crystal nucleus of copper having a crystal grain diameter of 0.2 µm or less and a crystal nucleus of silver having a crystal grain diameter of 0.2 µm or less from the copper-silver ink, and (4) a crystal nucleus synthesis step of synthesizing the crystal nucleus of copper and the crystal nucleus of silver. Each of the steps is described below in detail.

(1) Ink preparation step of mixing copper salt particle, amine-based solvent, and silver salt particle, thereby preparing copper-silver ink (1-1) Copper Salt Particle The copper salt used in the synthesis method in the present invention is composed of acids and copper ions. The acid is not particularly limited so long as the salt is soluble in the amine-based solvent. For example, a copper carboxylate is desirable. Examples of the copper carboxylate include fine particles of copper formate, fine particles of copper hydroxyacetate, fine particles of copper glyoxylate, fine particles of copper lactate, fine particles of copper oxalate, fine particles of copper tartrate, fine particles of copper malate, and fine particles of copper citrate. Of these, copper formate particles are preferred from the standpoint of low cost. One of these copper salts may be used alone, or two or more thereof may be used in combination. In the case of using two or more thereof in combination, these copper salts may be mixed in any desired proportion.

The copper ion may be any of the mono- to trivalent copper ions.

The average primary-particle diameter of the copper salt particles are not particularly limited, because the copper salt particles dissolve in the amine-based solvent.

The copper salt particles used in the present invention are not particularly limited, and may be commercial ones or may be ones synthesized by a comment method. Methods for production thereof are also not particularly limited.

(1-2) Amine-Based Solvent

The amine-based solvent used in the synthesis method in the present invention is not particularly limited. For example, aliphatic amines, aromatic amines, and cyclic amines are preferred from the standpoints that the copper salt particles and the silver salt particles described below readily dissolve therein and that the amine-based solvent can be easily removed in forming conduction parts.

Examples of the aliphatic amines include alkylamines, alkanolamines, alkylenediamines, cyclic amines, and amidine compounds. Preferred of these is 2-ethylhexylamine. Examples of the aromatic amines include aniline, p-toluidine, 4-ethylaniline, N-methylaniline, N-methyl-p-toluidine, and N-methyl-4-ethylaniline Examples of the cyclic amines include pyrrolidine, pyrrole, piperidine, pyridine, hexamethyleneimine, imidazole, pyrazole, piperazine, N-methylpiperazine, N-ethylpiperazine, and homopiperazine.

In the electroconductive ink composition in the present invention, the amine-based solvent may be a commercial one or may be one synthesized by a common method.

(1-3) Silver Salt Particle

The silver salt used in the synthesis method in the present invention is composed of acids and silver ions. The acid is not particularly limited so long as the salt is soluble in the amine-based solvent. For example, a carboxylic acid is desirable.

As the silver carboxylate, a silver β-ketocarboxylate is preferable from the standpoint of reducing the concentration of any raw material and impurities remaining in the formation of metallic silver.

Examples of the silver β-ketocarboxylate include silver 2-methylacetoacetate, silver acetoacetate, silver 2-ethylacetoacetate, silver propionylacetate, silver isobutyrylacetate, silver pivaloylacetate, silver caproylacetate, silver 2-n-butylacetoacetate, silver 2-benzylacetoacetate, silver benzoylacetate, silver pivaloylacetoacetate, silver rylacetoacetate, silver 2-acetylpivaloylacetate, silver 2-acetylisobutyrylacetate, and silver acetonedicarboxylate.

The average primary-particle diameter of the silver salt particles is not particularly limited, like the average primary-particle diameter of the copper salt particles, because the silver salt particles dissolve in the amine-based solvent.

One kind of silver salt particles may be used alone, or two or more kinds of silver salt particles may be used in combination. In the case of using two or more kinds of silver salt particles in combination, the two kinds of particles may be mixed in any desired proportion.

The silver salt particles used in the present invention are not particularly limited, and may be commercial ones or may be ones synthesized by a common method. Methods for production thereof are also not particularly limited.

(1-4) Mixing Ratio between Copper Salt Particle, Amine-based Solvent, and Silver Salt Particle With respect to the mixing ratio between the copper salt particles and the silver salt particles, it is preferred to mix the two kinds of particles so as to result in a copper/silver ratio of 5/95 to 95/5 after sintering. So long as the mixing ratio is within that range, oxidation and migration can be inhibited, and oxidation during heating and migration during heating can be inhibited. The total content of the copper salt particles and the silver salt particles is preferably 5% by mass to 95% by mass based on the total mass of the copper-silver ink. The content of the amine-based solvent is preferably 5% by mass to 50% by mass based on the total mass of the copper-silver ink.

(1-5) Dispersion Medium

The copper-silver ink may further contain at least one of alcohols such as methanol and ethanol, ethers such as diethyl ether, esters such as methyl formate, aliphatic hydrocarbons such as n-hexane, and aromatic hydrocarbons such as benzene. The content of such a dispersion medium is preferably 0% by mass to 90% by mass based on the total mass of the copper-silver ink.

(1-6) Mixing for Producing the Copper-Silver Ink

Mixing methods are not particularly limited. A suitable method may be selected from common methods such as a mixing method by rotating a stirrer, stirring blades or the like, a mixing method using a mixer, three-roll mill, kneader, bead mill or the like, and a mixing method by ultrasonic waves.

In the present invention, from the standpoint of inhibiting silver mirror reaction, it is desirable to prepare the copper-silver ink by adding a given amount of a copper salt to an amine-based solvent, mixing them, thereafter adding a given amount of a silver salt thereto, and then mixing them.

The temperature during the mixing is not particularly limited so long as the ingredients do not deteriorate, and the temperature is preferably −5° C. to 60° C. It is desirable that the temperature during the mixing is suitably regulated depending on the kinds and amounts of the ingredients so that the mixture obtained by mixing the ingredients has a viscosity suitable for stirring.

The mixing time is not particularly limited so long as the ingredients for the copper-silver ink do not deteriorate. The mixing time is preferably 10 minutes to 1 hour.

The viscosity of the copper-silver ink obtained by the mixing may be any viscosity which renders the ink printable, and is suitably regulated depending on coating methods.

(2) Coating Step of Coating Member to be Coated with the Copper-Silver Ink

In the synthesis method in the present invention, methods for coating a base material with the copper-silver ink are not particularly limited, and common methods may be used. Examples thereof include screen printing, dip coating, spray coating, spin coating, ink-jet printing, and application with a dispenser. The shape of coating ink is not particularly limited, and the shape of coating ink may be either a planar shape or a dot arrangement without arousing any problem. The amount of the copper-silver ink with which the base material is coated may be suitably regulated depending on the desired thickness of the conduction part.

In the synthesis method in the present invention, the member to be coated may be either a solid or a liquid or a gas. Examples thereof include organic substances such as resists, resins, and garments, metals, ceramics, glasses, substrates, semiconductor elements, ice, wood, and skin, and main examples thereof include surfaces and through holes of substrates. However, the member to be coated is not limited to these examples.

(3) Preheating Step of Performing Preheating at 25° C. or Higher and Lower than 70° C. for 0 Minute to 10 Minutes After Coating Step and Before Crystal Nucleus Formation Step It is desirable in the present invention that some of the amine-based solvent and dispersion medium which are components of the copper-silver ink are removed before heating. Hence, a preheating step of preheating the coating ink at 25° C. or higher and lower than 70° C. for 0 minute to 10 minutes may be further conducted after the coating step and before the crystal nucleus formation step. The preheating step and first-heating may be conducted successively as in common methods. In the case where a heating device for the preheating step is different from that for the first-heating in the crystal nucleus formation step described below, the substrate may be cooled to room temperature before the crystal nucleus formation step. The preheating step may be conducted in an atmosphere that is either the air or an inert atmosphere, because the heating temperature is lower than 70° C. In the preheating step, no crystal nuclei are formed or crystal nuclei may be formed in such a slight amount that the control of crystal nuclei is possible in the crystal nucleus formation step.

(4) Crystal Nucleus Formation Step of Forming at Least One of Crystal Nucleus of Copper Having Crystal Grain Diameter of 0.2 μm or Less and Crystal Nucleus of Silver Having Crystal Grain Diameter of 0.2 μm or Less from the Copper-Silver Ink Application of the synthesis method in the present invention enables fine crystal nuclei of silver and copper to be formed and causes the diffusion and growth of copper and silver to occur from the crystal nuclei as starting points to form an alloy. In this step, control of the crystal nuclei is extremely important for alloy formation. In a case where crystal nuclei are formed in an unnecessarily large amount, this results in crystal-nucleus enlargement depending on the conditions used for the formation. Meanwhile, in a case where the formation of crystal nuclei is insufficient, alloying is difficult.

So long as fine crystal nuclei are formed just in an amount necessary for allying, a copper-silver alloy can be easily synthesized by the subsequent crystal nucleus synthesis step. It is desirable that in the crystal nucleus formation step, crystal nuclei of copper and crystal nuclei of silver are formed so that the copper salt and silver salt in the copper-silver ink do not remain.

In the present invention, formation of at least either of crystal nuclei of copper or crystal nuclei of silver suffices in the crystal nucleus formation step. Even if crystal nuclei of only one of the metals are formed, crystal nuclei of the other metal can be formed in the crystal nucleus synthesis step described below, thereby forming a copper-silver alloy. It is preferable that in the crystal nucleus formation step in the present invention, both crystal nuclei of copper and crystal nuclei of silver are formed.

The grain diameter of the crystal nuclei must be 0.2 μm or less from the standpoint of the homogenization of the copper-silver alloy. Since the grain diameter thereof is within that range, diffusion can readily occur throughout the crystal nuclei to synthesize an alloy in the crystal nucleus synthesis step described below. In addition, in a case where a large number of crystal nuclei having that grain diameter are present, these crystal nuclei inhibit the copper-silver alloy phase from enlarging through the mutual diffusion and growth, making it possible to synthesize a fine and homogeneous copper-silver alloy. The average grain diameter of the crystal nuclei of copper is preferably 0.1 μm or less, and the average grain diameter of the crystal nuclei of silver is preferably 0.1 μm or less. Although there is no particular lower limit on the average grain diameter, the average grain diameter thereof is preferably 10 nm or larger. In a case where the average grain diameter thereof is within that range, the crystal nuclei can be prevented from flying off during irradiation with pulsed light.

In the present invention, the average grain diameter of crystal nuclei was determined by taking ten photographs of different portions of a sample using a scanning electron microscope (SEM: Hitachi SU8020 FE-SEM), extracting a hundred crystal nucleus grain diameters from each photograph, subjecting the 1,000 grain diameters in total to image analysis to calculate the projected-area equivalent circular diameter of each grain, and calculating the arithmetic mean of these diameter values.

From the standpoint of forming crystal nuclei having a grain diameter of 0.2 μm or less, which are essential for alloying, it is preferable that the first-heating is performed so that the heating temperature and heating time for the substrate are regulated so as to be within the ranges below. The heating temperature is preferably in the range of 70° C. to 300° C. In the case where the heating temperature is lower than 70° C., the formation of crystal nuclei is insufficient for alloying. The heating temperature is more preferably 80° C. or higher, in terms of the lower limit thereof. Meanwhile, in the case where the heating temperature exceeds 300° C., the crystal nuclei of copper may oxidize, making it difficult to obtain a copper-silver alloy. In terms of the upper limit thereof, the heating temperature is more preferably 200° C. or lower, still more preferably 160° C. or lower, especially preferably 140° C. or lower, most preferably 130° C. or lower.

The heating time in the first-heating is desirably 1 minute to 300 minutes from the standpoint of controlling the crystal nuclei. In the case where the heating time is less than 1 minute, the formation of crystal nuclei is insufficient for alloying. In terms of the lower limit thereof, the heating time is preferably 2 minutes or longer, more preferably 3 minutes or longer. Meanwhile, in the case where the heating time exceeds 300 minutes, the production cost increase and there are cases where the copper oxidizes to inhibit the alloying. In terms of the upper limit thereof, the heating time is preferably 100 minutes or less, more preferably 30 minutes or less, still more preferably 10 minutes or less, especially preferably 9 minutes or less.

The atmosphere for the first-heating may be either the air or an inert atmosphere such as nitrogen. From the standpoint of inhibiting the oxidation of the copper, it is preferred to perform the heating in an inert atmosphere.

In the case of performing the first-heating in the air, it is desirable that the heating temperature is 70° C. to 140° C. and the heating time is 1 minute to 10 minutes, from the standpoint of inhibiting the oxidation of the copper to control the crystal nuclei. In the case of performing the first-heating in an inert atmosphere such as nitrogen, there is no need of taking account of the oxidation of the copper, and hence, the heating temperature and the heating time may be any values within the ranges described above.

Heating devices for the first-heating step are not particularly limited, and any of devices as in common methods, such as a hot plate or a heating oven, may be used. The copper-silver ink may be irradiated with pulsed light having a reduced energy density.

(5) Cooling Step of Cooling the Coated Member to Temperature Region of Lower than 60° C. After the Crystal Nucleus Formation Step and Before Crystal Nucleus Synthesis Step In the present invention, it is preferred to cool the substrate to a temperature region of lower than 60° C. after the crystal nucleus formation step and before the crystal nucleus synthesis step described below, in order to inhibit the copper from oxidizing and to inhibit coarse crystal nuclei from being formed. This cooling is also applicable in a case where the heating device for the first-heating is different from that for the second-heating and the sample which has undergone the crystal nucleus formation step needs to be temporarily taken out and this inevitably results in a cooling step. The cooling temperature is preferably 40° C. or lower, and it is especially preferred to cool the substrate to room temperature, from the standpoint of simplifying the production process.

(6) Crystal Nucleus Synthesis Step of Synthesizing Crystal Nuclei of Copper and Crystal Nuclei of Silver In the synthesis method in the present invention, so long as the desired crystal nuclei have been formed in the crystal nucleus formation step, the crystal nuclei diffuse and grow in the crystal nucleus synthesis step and a copper-silver alloy can be easily synthesized.

In the crystal nucleus synthesis step in the present invention, it is preferred to perform a second-heating of irradiating the crystal nuclei of copper and the crystal nuclei of silver with pulsed light having an energy density of 0.5 J/cm$^2$ to 5.0 J/cm$^2$ for an irradiation time of 1 s or less. The irradiation with pulsed light under the conditions within those ranges makes it possible to instantaneously synthesize copper and silver without the need of disposing a means for inhibiting the oxidation of the copper and without taking account of the difference in oxidation-reduction potential, which is an obstacle in reduction methods.

So long as the irradiation time is 1 s or less, alloying is attained. In terms of the lower limit, the irradiation time is preferably 1 μs or longer from the standpoints of attaining sufficient diffusion and growth and inhibiting the crystal nuclei from flying off due to an elevated energy density. Irradiation times of 1 μs or longer are advantageous in that even if only either crystal nuclei of copper or crystal nuclei of silver have been formed in the crystal nucleus formation step, crystal nuclei of the other metal can be sufficiently formed in the crystal nucleus synthesis step. From the standpoint of reducing the production cost, the irradiation time is preferably 0.1 s or less, in terms of the upper limit thereof.

The number of irradiation operations is desirably 1 to 10, preferably 1 to 5, and is especially preferably 1 from the standpoints of cost reduction and process simplification.

The atmosphere for the second-heating is not particularly limited because alloying can be attained in an extremely short time period as described above. From the standpoint of process simplification, the atmosphere for the second-heating is preferably the air.

In the case where the energy density of the pulsed light is 0.5 J/cm$^2$ to 5.0 J/cm$^2$, alloying is attained. In the case where the energy density is too low and the irradiation time is too short, this may result in insufficient diffusion and growth. In terms of the lower limit, the energy density is preferably 1.0 J/cm$^2$ or higher. Meanwhile, in terms of the upper limit, the energy density is preferably 4.0 J/cm$^2$ or less from the standpoints of reducing the production cost and inhibiting the crystal nuclei from flying off.

The pulsed light used in the present invention desirably has a wavelength of, for example, 1 m to 1 mm (frequency of 300 MHz to 300 GHz). In the case where the number of irradiation operations is 1, the irradiation time corresponds to pulse width.

(7) Copper-Silver Alloy

The copper-silver alloy obtained by the synthesis method of the present invention includes silver and copper crystal grains, the diameters of which are small to such a degree that no grain boundaries can be recognized on SEM photographs. Specifically, the copper-silver alloy has a crystal grain diameter of 0.1 μm or less.

In the present invention, peak angles are determined from an X-ray diffraction profile and alloying is assessed on the basis of the difference(s) from the peak angle(s) of pure copper and/or pure silver. In the copper-silver alloy obtained in the present invention, a peak assigned to copper and a peak assigned to silver are observed, and hence, both a silver phase and a copper phase are present. The copper-silver alloy synthesized in the present invention has excellent oxidation resistance and can be inhibited from suffering migration.

Specifically, the requirement concerning the difference(s) from the peak angle(s) of pure copper and/or pure silver means that the alloy is a copper-silver alloy consisting of Cu and Ag and satisfying the requirement that the difference between a peak of (111) plane angle of the Cu and a peak of (111) plane angle of pure Cu is at least 0.3% of the peak of (111) plane angle of the pure Cu and/or the requirement that the difference between a peak of (111) plane angle of the Ag and a peak of (111) plane angle of pure Ag is at least 0.1% of the peak of (111) plane angle of the pure Ag. Preferably, the difference between the peak of (111) plane angle of the Cu and the peak of (111) plane angle of pure Cu is at least 0.3% of the peak of (111) plane angle of the pure Cu and the difference between the peak of (111) plane angle of the Ag and the peak of (111) plane angle of pure Ag is at least 0.1% of the peak of (111) plane angle of the pure Ag.

In the case where the difference between the peak of (111) plane angle of the Cu and the peak of (111) plane angle of pure Cu is at least 0.812% of the peak of (111) plane angle of the pure Cu and/or the difference between the peak of (111) plane angle of the Ag and the peak of (111) plane angle of pure Ag is at least 0.231% of the peak of (111) plane angle of the pure Ag, then this alloy has more excellent oxidation resistance and is more inhibited from suffering migration.

2. Method for Forming Conduction Part, and Conduction Part

By the synthesis method of the present invention, a conduction part can be formed on a substrate. The term "conduction part" in the present invention means, for example, a wiring, a connecting part which connects a wiring to a terminal, or the like. For example, that term means any of all the conductive portions of a wearable device.

The conduction part obtained in the present invention includes a copper phase and a silver phase and, despite this, the two phases are in a finely and evenly dispersed state. The conduction part shows excellent oxidation resistance and low resistivity.

EXAMPLES

Specific examples in the present invention are given below, but the present invention is not limited thereto.

1. Preparation of Copper-Silver Inks

First, 2-ethylhexylamine (manufactured by Wako Pure Chemical Industries, Ltd.) was introduced into a beaker. Next, copper (II) formate tetrahydrate (manufactured by Wako Pure Chemical Industries, Ltd.; Type No. LKJ3210; average primary-particle diameter: 20 pm) was added thereto, and the ingredients were mixed together for 30 minutes using a magnetic stirrer to dissolve the copper formate. Thereafter, silver acetoacetate was added and mixed therewith for 30 minutes using the magnetic stirrer to dissolve the silver acetoacetate, thereby preparing copper-silver inks. The contents of the copper formate, 2-ethylhexylamine, silver acetoacetate, and ethanol are as shown in Table 1.

In Invention Example 2, a copper-silver ink was prepared in the same manner as described above, except that 2-amino-2-methyl-1-propanol (manufactured by Wako Pure Chemical Industries, Ltd.) was introduced into the beaker.

2. Coating of Substrate

The copper-silver inks shown in Table 1 were each printed on a polyimide film (thickness: 25 μm) (manufactured by Du Pont-Toray Co., Ltd.; Type No. Kapton 100N) by screen printing so as to form a square pattern of 2 cm×2 cm.

3. Preheating

Next, this substrate was preheated in the same atmosphere as in first-heating in a heating oven under the conditions shown in Table 1.

4. First-Heating

The substrate which had undergone the preheating was subjected, in the state of being held in the heating oven used in the preheating, to first-heating under the conditions shown in Table 1. A Cu:Ag mass ratio after the heating was calculated from the copper salt content and silver salt content in the copper-silver ink.

5. Cooling

The substrate was taken out of the heating oven and cooled to room temperature.

6. Second-Heating

The substrate which had been cooled was irradiated in the air with the pulse wave 1, pulse wave 2, or pulse wave 3 shown below, using Pulse Forge 3300, manufactured by Novacentrix.

"Pulse wave 1": single shot performed under the conditions of a voltage of 300 V, a pulse width of 2,100 μs and a pulse energy of 3.357 J/cm$^2$ "Pulse wave 2": four shots performed under the conditions of a voltage of 240 V, a pulse width of 2,100 μs, and a pulse energy of 1.751 J/cm$^2$, followed by single shot performed under the conditions of a voltage of 300 V, a pulse width of 2,100 μs, and a pulse energy of 3.357 J/cm$^2$ "Pulse wave 3": single shot performed under the conditions of a voltage of 240 V, a pulse width of 2,100 μs, and a pulse energy of 1.751 J/cm$^2$ The electroconductive patterns thus formed each had a thickness of 25 μm.

7. Evaluation (1) Ascertainment of Alloying

The synthesized patterns were each examined by XRD (X-ray diffractometry: curved IP X-ray diffractometer RINT RAPID II, manufactured by Rigaku Corp.; measurement conditions: continuous scanning with standard holder; X-ray tube, Cu (40 kV/30 mA); collimator, f 0.8 mm; ω, 20°; f, 1/sec; scanning time, 360 sec; receiving slit (RS), 0.15 mm). Here, the peak of (111) plane angles of the Ag and the peak of (111) plane angles of the Cu were determined. In the case where the difference from a peak angle of pure silver was at least 0.3% of the peak angle of pure silver and the difference from a peak angle of pure copper was at least 0.1% of the peak angle of pure copper, it was deemed that the copper and the silver had been alloyed. The case where alloying had been achieved is indicated by "501", and the case where alloying had not been achieved is indicated by "×".

(2) Resistivity

Resistivity was measured by the four-point method using measuring device Iozesta-GP MCP-T610, manufactured by Mitsubishi Chemical Corp. The four-point probe used in the measurement was ESP probe (MCP-TP08P, No. 014052B).

The results are shown in Table 1.

TABLE 1

| | Copper-silver ink | | | | Preheating | |
|---|---|---|---|---|---|---|
| | Amount of copper salt (g) | Amount of amine-based solvent (g) | Amount of silver salt (g) | Amount of ethanol (g) | Temperature (° C.) | Time (min) |
| Invention Example 1 | 2.79 | 3.47 | 0.47 | | 25 | 5 |
| Invention Example 2 | 2.79 | 3.47 | 0.47 | | 25 | 5 |
| Invention Example 3 | 2.79 | 3.47 | 0.47 | | 25 | 5 |
| Invention Example 4 | 2.79 | 3.47 | 0.47 | | 25 | 5 |
| Invention Example 5 | 2.79 | 3.47 | 0.47 | | 25 | 5 |
| Invention Example 6 | 9.32 | 11.2 | 0.47 | | 25 | 5 |
| Invention Example 7 | 7.45 | 9.09 | 0.47 | | 25 | 5 |
| Invention Example 8 | 3.72 | 4.82 | 0.47 | | 25 | 5 |
| Invention Example 9 | 2.79 | 3.74 | 0.47 | | 25 | 5 |
| Invention Example 10 | 0.47 | 1.07 | 0.47 | | 25 | 5 |
| Invention Example 11 | 0.47 | 2.07 | 1.85 | | 25 | 5 |
| Invention Example 12 | 2.79 | 3.74 | 0.47 | | 25 | 5 |
| Invention Example 13 | 2.79 | 3.47 | 0.47 | | 25 | 5 |
| Invention Example 14 | 2.79 | 3.74 | 0.47 | | 25 | 5 |
| Invention Example 15 | 2.79 | 3.74 | 0.47 | | 25 | 5 |
| Invention Example 16 | 2.79 | 3.74 | 0.47 | 0.5 | 25 | 5 |
| Comparative Example 1 | 2.79 | 3.74 | — | | 25 | 5 |
| Comparative Example 2 | — | 3.74 | 0.47 | | 25 | 5 |
| Comparative Example 3 | 2.79 | 3.74 | 0.47 | | 25 | 5 |
| Comparative Example 4 | 2.79 | 3.74 | 0.47 | | 25 | 5 |
| Comparative Example 5 | 2.79 | 3.74 | 0.47 | | 25 | 5 |
| Comparative Example 6 | 2.79 | 3.74 | 0.47 | | 25 | 5 |
| Comparative Example 7 | 2.79 | 3.74 | 0.47 | | 25 | 5 |

TABLE 1-continued

| | | | | | | | |
|---|---|---|---|---|---|---|---|
| Comparative Example 8 | 2.79 | 3.74 | 0.47 | | 25 | | 5 |
| Comparative Example 9 | 2.79 | 3.74 | 0.47 | | 25 | | 5 |
| Comparative Example 10 | 2.79 | 3.74 | 0.47 | | 25 | | 5 |
| Comparative Example 11 | 2.79 | 3.74 | 0.47 | | 25 | | 5 |

| | First heating | | | Cooling Cooling | Second heating | Cu:Ag (mass | Evaluation | |
|---|---|---|---|---|---|---|---|---|
| | Temperature (° C.) | Time (min) | Atmosphere | Temperature (° C.) | Irradiation method | ratio) after heating | Alloying | Resistivity (μΩcm) |
| Invention Example 1 | 80 | 10 | $N_2$ | Room temperature | Pulse wave 1 | 78:22 | ○ | 3.7 |
| Invention Example 2 | 80 | 10 | $N_2$ | Room temperature | Pulse wave 1 | 78:22 | ○ | 4.8 |
| Invention Example 3 | 140 | 5 | $N_2$ | Room temperature | Pulse wave 1 | 78:22 | ○ | 3.5 |
| Invention Example 4 | 140 | 30 | $N_2$ | Room temperature | Pulse wave 1 | 78:22 | ○ | 3.9 |
| Invention Example 5 | 140 | 100 | $N_2$ | Room temperature | Pulse wave 1 | 78:22 | ○ | 3.5 |
| Invention Example 6 | 140 | 10 | $N_2$ | Room temperature | Pulse wave 1 | 92:8 | ○ | 4.5 |
| Invention Example 7 | 140 | 10 | $N_2$ | Room temperature | Pulse wave 1 | 90:10 | ○ | 4.3 |
| Invention Example 8 | 140 | 10 | $N_2$ | Room temperature | Pulse wave 1 | 82:18 | ○ | 4 |
| Invention Example 9 | 140 | 10 | $N_2$ | Room temperature | Pulse wave 1 | 78:22 | ○ | 3.5 |
| Invention Example 10 | 140 | 10 | $N_2$ | Room temperature | Pulse wave 1 | 37:63 | ○ | 3.5 |
| Invention Example 11 | 140 | 10 | $N_2$ | Room temperature | Pulse wave 1 | 13:87 | ○ | 8 |
| Invention Example 12 | 140 | 10 | Air | Room temperature | Pulse wave 2 | 78:22 | ○ | 5.3 |
| Invention Example 13 | 140 | 5 | $N_2$ | Room temperature | Pulse wave 3 | 78:22 | ○ | 6.3 |
| Invention Example 14 | 300 | 5 | $N_2$ | Room temperature | Pulse wave 1 | 78:22 | ○ | 3.6 |
| Invention Example 15 | 300 | 30 | $N_2$ | Room temperature | Pulse wave 1 | 78:22 | ○ | 3.7 |
| Invention Example 16 | 140 | 5 | $N_2$ | Room temperature | Pulse wave 1 | 78:22 | ○ | 3.6 |
| Comparative Example 1 | 140 | 5 | $N_2$ | Room temperature | Pulse wave 1 | 100:0 | — | 57 |
| Comparative Example 2 | 140 | 5 | $N_2$ | Room temperature | Pulse wave 1 | 0:100 | — | 18 |
| Comparative Example 3 | 70 | 5 | $N_2$ | Room temperature | = | 78:22 | x | x |
| Comparative Example 4 | 70 | 30 | $N_2$ | Room temperature | = | 78:22 | x | x |
| Comparative Example 5 | 140 | 5 | $N_2$ | Room temperature | = | 78:22 | x | 43 |
| Comparative Example 6 | 140 | 10 | $N_2$ | Room temperature | = | 78:22 | x | 38 |
| Comparative Example 7 | 140 | 30 | $N_2$ | Room temperature | = | 78:22 | x | 32 |
| Comparative Example 8 | 140 | 10 | Air | Room temperature | = | 78:22 | x | x |
| Comparative Example 9 | 300 | 5 | $N_2$ | Room temperature | = | 78:22 | x | 27 |
| Comparative Example 10 | 300 | 30 | $N_2$ | Room temperature | = | 78:22 | x | 24 |
| Comparative Example 11 | = | = | = | = | Pulse wave 1 | 78:22 | x | x |

As apparent from the results in Table 1, copper-silver alloys in which copper crystal nuclei and silver crystal nuclei had been alloyed with each other were obtained in the Invention Examples. These copper-silver alloys each showed low resistivity. In Invention Example 12, the first-heating was performed in the air and, despite this, a copper-silver alloy was obtained and this alloy showed low resistivity. It was confirmed that the alloys obtained in the Invention Examples each had an average grain diameter of crystal nucleus of 0.2 μm or less, as described below. Furthermore, the electroconductive patterns constituted of copper-silver alloys of the Invention Examples each showed excellent oxidation resistance.

Meanwhile, in Comparative Example 1 and Comparative Example 2, a raw material for synthesizing a copper-silver alloy was not incorporated.

In Comparative Examples 3 to 10, a copper-silver alloy was not obtained because the second-heating was omitted. In Comparative Examples 3 and 4 among these, an electroconductive pattern was not formed because the heating temperature in the first-heating was low and the organic components were not decomposed, and the resistivity measurement was impossible. Comparative Examples 5 to 7, 9, and 10 gave electroconductive patterns in which the crystal nuclei were in the state of being in mere physical contact with one another and which showed high resistivity, because the second-heating was omitted although the heating temperature in the first-heating was high and the organic components were sufficiently decomposed.

In Comparative Example 8, the first-heating only was performed in the air, and an electroconductive pattern was hence not formed due to the oxidation of the copper. The resistivity measurement was impossible.

In Comparative Example 11, the first-heating was omitted and the second-heating only was conducted. Because of this, the copper-silver ink bumped, making it impossible to maintain the printed pattern and a copper-silver alloy was not synthesized. The resistivity measurement was hence difficult.

Further explanations are made in detail on the basis of the results given in Table 1.

FIG. 1 is a chart showing the results of an X-ray diffractometry (XRD) experiment obtained in Comparative Example 1, Comparative Example 2, Comparative Example 6, Invention Example 13, and Invention Example 9. In FIG. 1, "Pure Cu" indicates the case of Comparative Example 1, "Pure Ag" indicates the case of Comparative Example 2, "140° C.–10 min" indicates the case of Comparative Example 6, "First-heating+pulsed light (1,751 mJ/cm$^2$)" indicates the case of Invention Example 13, and "First-heating+pulsed light (3,357 mJ/cm$^2$)" indicates the case of Invention Example 9.

The followings are apparent from FIG. 1. In Invention Example 13 and Invention Example 9, the peaks for the Ag (111) plane were found to have shifted to the larger-angle side from 38.16° for pure Ag. The difference of the peak of (111) plane angle of the Ag was (|38.3−38.16|÷38.16)×100≈0.366%, and was found to be in the range of 0.3% and larger. The peak for the Cu (111) plane was found to have shifted from 43.34° to the smaller-angle side. The difference of the peak of (111) plane angle of the Cu was (|43.29−43.34|÷43.34)×100≈0.115%, and was found to be 0.1% or larger. It hence became clear that a copper-silver alloy had been formed in the Invention Examples.

In particular, in Invention Example 9, the difference of the peak of (111) plane angle of the Ag was found to be (|38.47−38.16|÷38.16)×100≈0.812%. The difference of the peak of (111) plane angle of the Cu was (|43.24−43.34|÷43.34)×100≈0.231%, showing that the peak angle had shifted considerably.

Meanwhile, in Comparative Example 6, the peak angles for the Ag (111) plane and Cu (111) plane were respectively the same as those for pure Ag and pure Cu, showing that the silver and the copper had not been alloyed. This is because the second-heating was omitted in Comparative Example 6.

The other Invention Examples and Comparative Examples were likewise examined for alloying, and the similar results as shown above were obtained.

Figure 2A:
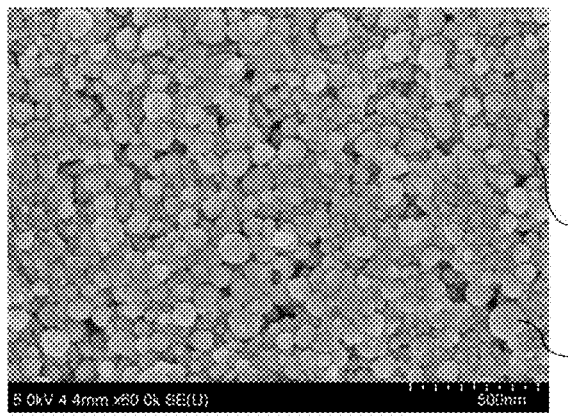
FIG. 2A to FIG. 2C show surface SEM photographs of the conduction parts obtained in Comparative Example 6, Invention Example 13, and Invention Example 9.
Figure 2B:
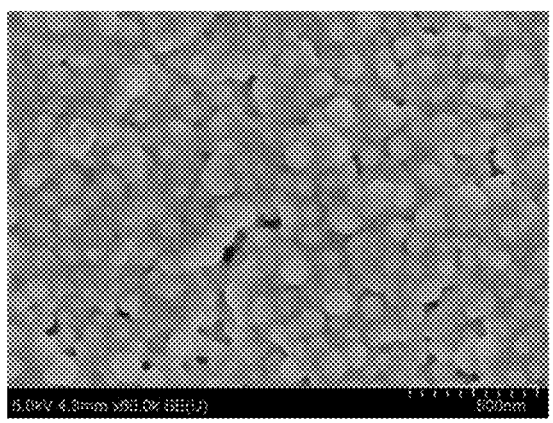
Figure 2C:
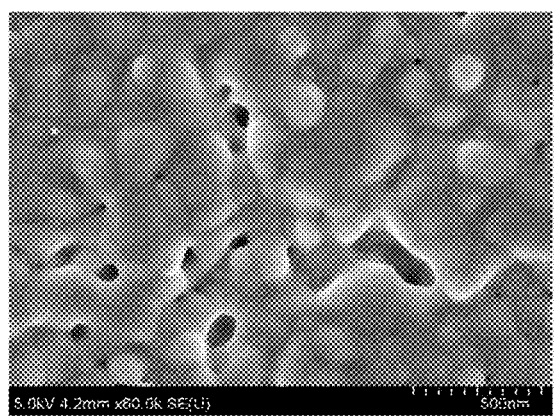

Next, the surface states in the case of Comparative Example 6, in the case of Invention Example 13, and in the case of Invention Example 9 were examined, respectively. FIG. 2A to FIG. 2C show surface SEM photographs of the conduction parts obtained in Comparative Example 6, Invention Example 13, and Invention Example 9. FIG. 2A is a surface SEM photograph in the case of Comparative Example 6; FIG. 2B is a surface SEM photograph in the case of Invention Example 13; and FIG. 2C is a surface SEM photograph in the case of Invention Example 9.

As apparent from FIG. 2A to FIG. 2C, it was able to be ascertained that the crystal nuclei in Invention Example 13 and Invention Example 9 had diffused and grown. It was found that, in Comparative Example 6, copper crystal nuclei and silver crystal nuclei were present as separate nuclei, and diffusion and growth were not ascertained. The copper and silver in Comparative Example 6 were thus found to have not been alloyed. The average grain diameters of crystal nuclei in the Invention Examples were substantially the same as those in Comparative Example 6, in which the second heating was omitted, and the average grain diameters of the copper crystal nuclei and silver crystal nuclei were 0.2 μm or less, respectively. The average grain diameter of crystal nuclei was determined by taking ten photographs of different portions of a sample, extracting a hundred crystal nucleus grain diameters from each photograph, subjecting the 1,000 grain diameters in total to image analysis to calculate the projected-area equivalent circular diameter of each grain, and calculating the arithmetic mean of these diameter values.

Next, the results obtained in Comparative Examples in which the first-heating only was performed and the results obtained in Invention Examples in which both the first-heating and the second-heating were performed are explained by reference to drawings in order to more clearly show a relationship between the presence or absence of the second-heating and alloying.

Figure 3:
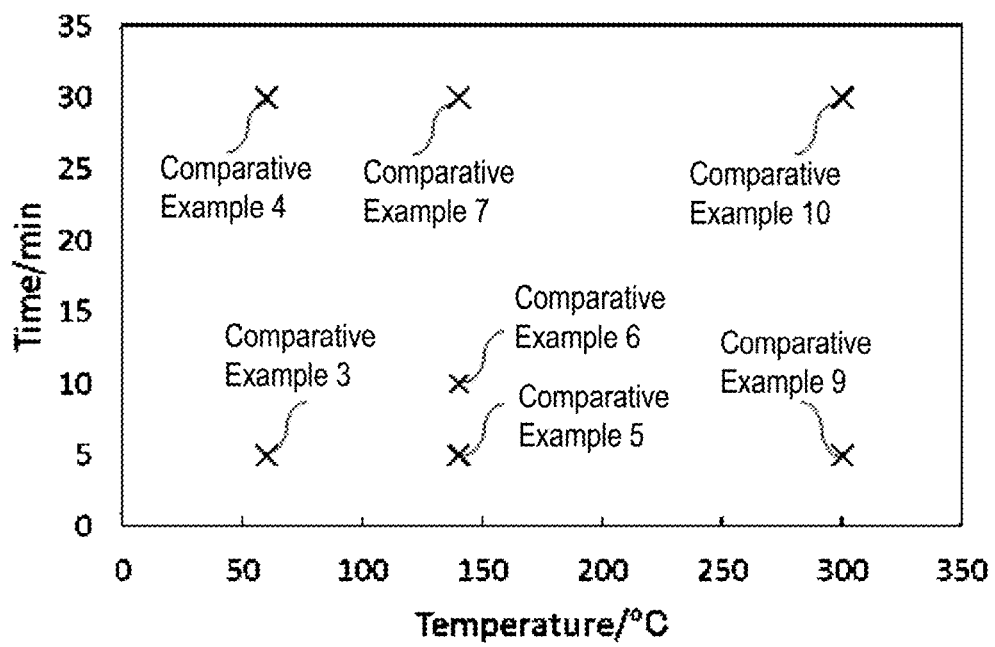
FIG. 3 is a chart showing the results of alloying in Comparative Example 3 to Comparative Example 7, Comparative Example 9, and Comparative Example 10.
Figure 4:
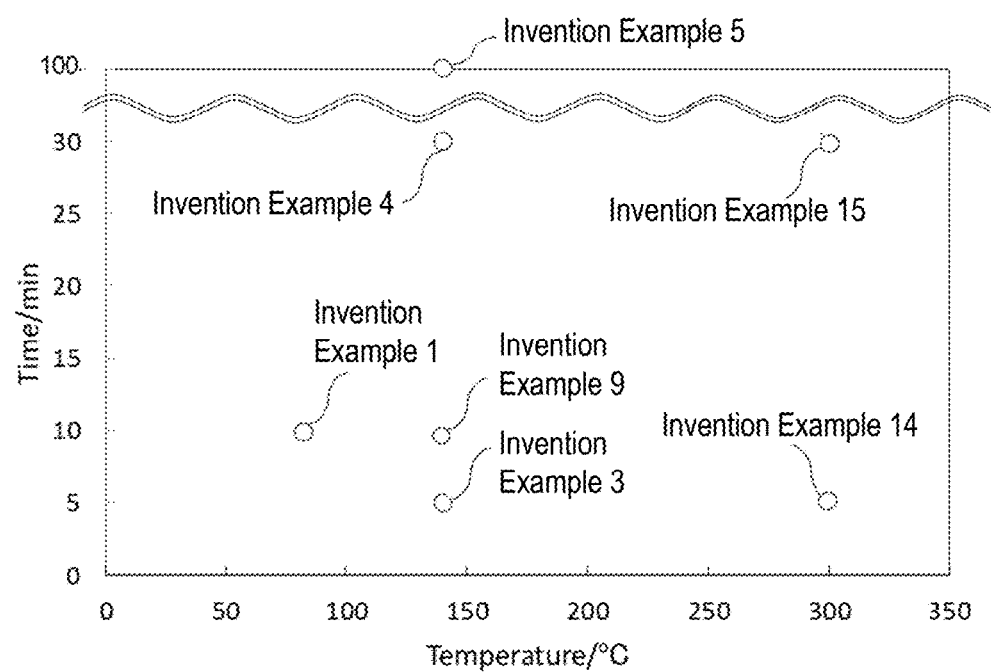
FIG. 4 is a chart showing the results of alloying in Invention Example 1, Invention Examples 3 to 5, Invention Example 9, Invention Example 14, and Invention Example 15.

FIG. 3 is a chart showing the results of alloying in Comparative Example 3 to Comparative Example 7, Comparative Example 9, and Comparative Example 10. FIG. 4 is a chart showing the results of alloying in Invention Example 1, Invention Examples 3 to 5, Invention Example 9, Invention Example 14, and Invention Example 15. As apparent from FIG. 3, a copper-silver alloy was not obtained in the Comparative Examples regardless of the heating temperature or heating time in the first-heating. It was thus found that the mere formation of crystal nuclei did not result in alloy formation. Meanwhile, as apparent from FIG. 4, copper-silver alloys were obtained in the Invention Examples regardless of the heating conditions for the first-heating, because the coating copper-silver inks had undergone both the first-heating and the second-heating.

Figure 5A:
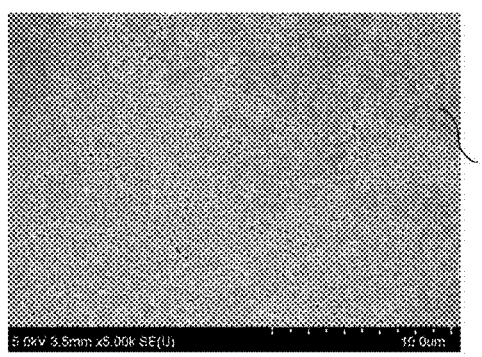
FIG. 5A to FIG. 5D show surface SEM photographs and rupture-surface SEM photographs obtained in Invention Example 9, and Comparative Reference Example in which metallic silver was melted at 1,200° C. in an inert atmosphere, metallic copper was thereafter introduced, and the silver and the copper were then mixed for 30 minutes and alloyed.
Figure 5C:
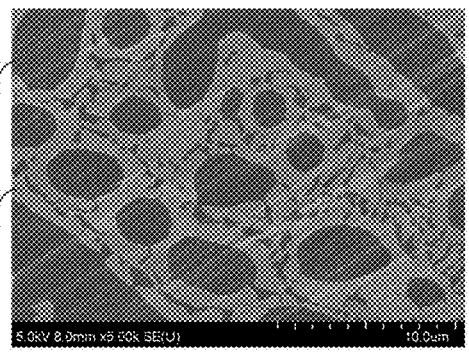
Figure 5B:
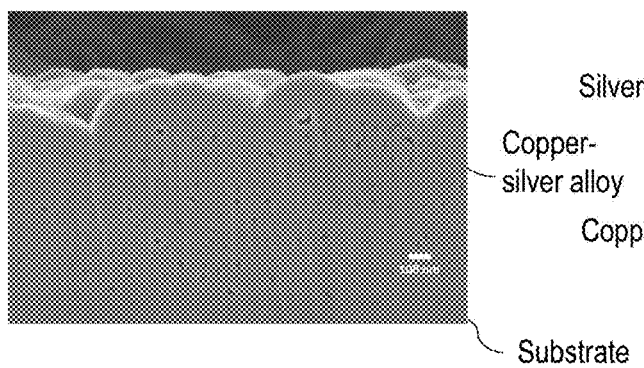
Figure 5D:
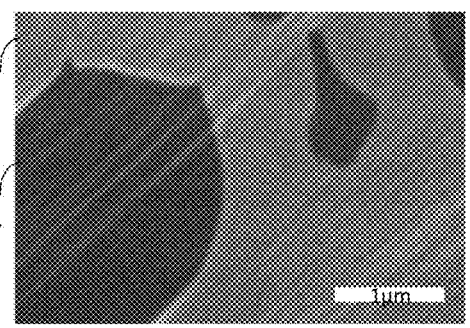

FIG. 5A to FIG. 5D show surface SEM photographs and rupture-surface SEM photographs obtained in Invention Example 9, and Comparative Reference Example in which metallic silver was melted at 1,200° C. in an inert atmosphere, metallic copper was thereafter introduced, and the silver and the copper were then mixed for 30 minutes and alloyed. FIG. 5A is a surface SEM photograph in Invention Example 9; FIG. 5B is a rupture-surface SEM photograph in Invention Example 9; FIG. 5C is a surface SEM photograph in Comparative Reference Example; and FIG. 5D is a rupture-surface SEM photograph in Comparative Reference Example.

As apparent from FIG. 5A to FIG. 5D, it was found that in Invention Example 9, a copper-silver alloy having crystal grains which were too fine to be observed on an SEM photograph with a scale of 0.1 μm was formed. Meanwhile, it was found that in Comparative Reference Example, a copper-silver alloy had been obtained but the copper phase and the silver phase had large grain diameters and that the alloying was not achieved by the diffusion and growth of crystal nuclei.

Figure 6:
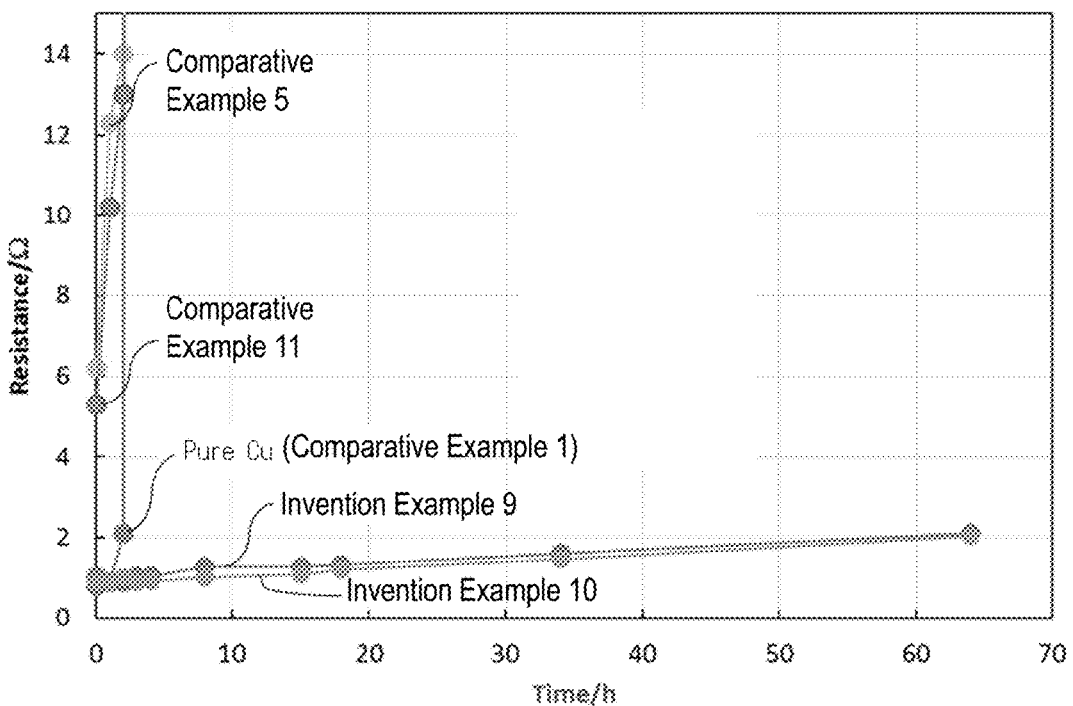
FIG. 6 is a chart showing relationships between holding time and resistance which were obtained for each of the samples of Invention Example 9, Invention Example 10, Comparative Example 1, Comparative Example 5, and Comparative Example 11, held in the air at 180° C.

Next, some of the produced electroconductive patterns were evaluated for oxidation resistance. FIG. 6 is a chart showing relationships between holding time and resistance which were obtained for the samples of Invention Example 9, Invention Example 10, Comparative Example 1, Comparative Example 5, and Comparative Example 11, held in the air at 180° C. As apparent from FIG. 6, the samples of Invention Examples 9 and 10 were less apt to oxidize and were inhibited from increasing in resistance, because these samples were copper-silver alloys. Meanwhile, the samples of the Comparative Examples were each found not to have oxidation resistance.

As described above, the synthesis method of the present invention can easily form a conduction part having excellent oxidation resistance, at a low temperature in a short time period, as compared with conventional methods. The present invention can hence be applied to devices for which formation of fine wiring is necessary, such as, in particular, wearable devices.

The invention claimed is:

1. A copper-silver alloy consisting of:
   Cu; and
   Ag, wherein
   the copper-silver alloy has an average crystal grain diameter of 0.1 μm or less, and satisfies a requirement that a difference between a peak of (111) plane angle of the Cu and a peak of (111) plane angle of pure Cu is at least 0.812% of the peak of (111) plane angle of the pure Cu and a requirement that a difference between a peak of (111) plane angle of the Ag and a peak of (111) plane angle of pure Ag is at least 0.231% of the peak of (111) plane angle of the pure Ag.

2. A conduction part comprising the copper-silver alloy according to claim 1.

* * * * *